United States Patent
Patel et al.

(10) Patent No.: US 11,442,642 B2
(45) Date of Patent: Sep. 13, 2022

(54) METHOD AND SYSTEM FOR INLINE DEDUPLICATION USING ERASURE CODING TO MINIMIZE READ AND WRITE OPERATIONS

(71) Applicant: Dell Products L.P., Hopkinton, MA (US)

(72) Inventors: Dharmesh M. Patel, Round Rock, TX (US); Rizwan Ali, Cedar Park, TX (US); Ravikanth Chaganti, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/260,772

(22) Filed: Jan. 29, 2019

(65) Prior Publication Data
US 2020/0241782 A1    Jul. 30, 2020

(51) Int. Cl.
G06F 3/06         (2006.01)
H03M 13/15        (2006.01)
G06F 11/10        (2006.01)

(52) U.S. Cl.
CPC ............ *G06F 3/0641* (2013.01); *G06F 3/065* (2013.01); *G06F 3/0608* (2013.01); *G06F 3/0619* (2013.01); *G06F 3/0673* (2013.01); *G06F 11/1076* (2013.01); *H03M 13/154* (2013.01)

(58) Field of Classification Search
CPC .... G06F 3/0641; G06F 3/0608; G06F 3/0619; G06F 3/065; G06F 3/0673; G06F 11/1076; H03M 13/154

USPC .......................................................... 711/162
See application file for complete search history.

(56) References Cited

U.S. PATENT DOCUMENTS

| | | |
|---|---|---|
| 4,780,809 A | 10/1988 | Woffinden |
| 5,689,678 A | 11/1997 | Stallmo et al. |
| 6,098,098 A | 8/2000 | Sandahl et al. |
| 6,223,252 B1 | 4/2001 | Bandera et al. |
| 6,516,425 B1 | 2/2003 | Belhadj et al. |
| 7,636,814 B1 | 12/2009 | Karr |
| 7,882,386 B1 | 2/2011 | Potnis et al. |
| 7,987,353 B2 | 7/2011 | Holdaway et al. |

(Continued)

FOREIGN PATENT DOCUMENTS

WO    2015114643 A1    8/2015

OTHER PUBLICATIONS

"Suzhen Wu, Huagao Luan, Bo Mao, Hong Jiag, Gen Niu, Hui Rao, Fang Yu, Jindong Zhou, Improving Reliability of Deduplication-based Storage Systems with Per-File Parity, 2018, Department of Computer Science and Engineering, University of Texas at Arlington, p. 173" (Year: 2018).*

(Continued)

*Primary Examiner* — Gautam Sain
(74) *Attorney, Agent, or Firm* — Chamberlain, Hrdlicka, White, Williams & Aughtry

(57) ABSTRACT

A method for storing data includes obtaining data, applying an erasure coding procedure to the data to obtain a plurality of data chunks and a parity chunk, deduplicating the plurality of data chunks to obtain a plurality of deduplicated data chunks, storing, across a plurality of nodes, the plurality of deduplicated data chunks and the parity chunk, and tracking location information for each of the plurality of deduplicated data chunks and the parity chunk.

9 Claims, 7 Drawing Sheets

(56) References Cited

U.S. PATENT DOCUMENTS

| | | |
|---|---|---|
| 8,037,345 B1 | 10/2011 | Iyer et al. |
| 8,099,571 B1 | 1/2012 | Driscoll et al. |
| 8,161,255 B2 | 4/2012 | Anglin et al. |
| 8,190,835 B1 | 5/2012 | Yueh |
| 8,364,917 B2 | 1/2013 | Bricker et al. |
| 8,386,930 B2 | 2/2013 | Dillenberger et al. |
| 8,583,769 B1 | 11/2013 | Peters et al. |
| 8,788,466 B2 | 7/2014 | Anglin et al. |
| 8,868,987 B2 | 10/2014 | Wagner |
| 8,874,892 B1 | 10/2014 | Chan et al. |
| 8,898,114 B1 | 11/2014 | Feathergill et al. |
| 8,949,208 B1 | 2/2015 | Xu et al. |
| 9,122,501 B1 | 9/2015 | Hsu et al. |
| 9,201,751 B1 | 12/2015 | Muthirisavenugopal |
| 9,256,378 B2 | 2/2016 | Zheng et al. |
| 9,256,381 B1 | 2/2016 | Fultz et al. |
| 9,278,481 B1 | 3/2016 | Hull |
| 9,355,036 B2 | 5/2016 | Beard et al. |
| 9,521,198 B1 | 12/2016 | Agarwala et al. |
| 9,696,939 B1 | 7/2017 | Frank et al. |
| 9,710,367 B1 | 7/2017 | Nagineni |
| 9,749,480 B1 | 8/2017 | Katano |
| 9,792,316 B1 | 10/2017 | Cremelie |
| 9,830,111 B1 | 11/2017 | Patiejunas et al. |
| 9,898,224 B1 | 2/2018 | Marshak et al. |
| 10,002,048 B2 | 6/2018 | Chennamsetty et al. |
| 10,013,323 B1 | 7/2018 | Puhov et al. |
| 10,013,325 B1 | 7/2018 | Garrett, Jr. et al. |
| 10,031,672 B2 | 7/2018 | Wang et al. |
| 10,057,184 B1 | 8/2018 | Prahlad et al. |
| 10,091,295 B1* | 10/2018 | Savic ................ G06F 16/1827 |
| 10,097,620 B2 | 10/2018 | Reddy et al. |
| 10,152,254 B1 | 12/2018 | Kang et al. |
| 10,185,624 B2* | 1/2019 | Akutsu ............. H04L 67/1097 |
| 10,241,695 B2 | 3/2019 | Baptist |
| 10,339,455 B1 | 7/2019 | Parush-tzur |
| 10,409,778 B1 | 9/2019 | Zhao et al. |
| 10,452,301 B1 | 10/2019 | Farhan |
| 10,503,413 B1 | 12/2019 | Gal et al. |
| 10,503,611 B1 | 12/2019 | Srivastav |
| 10,528,429 B1 | 1/2020 | Vempati et al. |
| 10,817,392 B1 | 10/2020 | Mcauliffe et al. |
| 10,929,256 B2 | 2/2021 | Danilov et al. |
| 10,956,601 B2 | 3/2021 | Surla et al. |
| 10,963,345 B2 | 3/2021 | Patel et al. |
| 10,990,480 B1 | 4/2021 | Bernat et al. |
| 11,005,468 B1 | 5/2021 | Subramanian et al. |
| 11,112,990 B1 | 9/2021 | Bernat et al. |
| 2001/0044879 A1 | 11/2001 | Moulton |
| 2003/0036882 A1 | 2/2003 | Harper et al. |
| 2003/0058277 A1 | 3/2003 | Bowman-Amuah |
| 2003/0065873 A1 | 4/2003 | Collins et al. |
| 2003/0172145 A1 | 9/2003 | Nguyen |
| 2003/0177205 A1 | 9/2003 | Liang et al. |
| 2004/0128587 A1 | 7/2004 | Kenchammana-hosekote |
| 2004/0153844 A1 | 8/2004 | Ghose et al. |
| 2004/0260967 A1 | 12/2004 | Guha et al. |
| 2005/0076049 A1 | 4/2005 | Qubti et al. |
| 2005/0086557 A1 | 4/2005 | Sato et al. |
| 2005/0182797 A1 | 8/2005 | Adkins et al. |
| 2005/0262385 A1 | 11/2005 | Mcneill et al. |
| 2005/0283655 A1 | 12/2005 | Ashmore |
| 2007/0214255 A1 | 9/2007 | Spitz et al. |
| 2007/0283011 A1 | 12/2007 | Rakowski et al. |
| 2008/0244204 A1 | 10/2008 | Cremelie et al. |
| 2009/0077165 A1 | 3/2009 | Rhodes et al. |
| 2009/0094250 A1 | 4/2009 | Dhuse |
| 2009/0235022 A1 | 9/2009 | Bates et al. |
| 2009/0265360 A1 | 10/2009 | Bachwani |
| 2010/0061207 A1 | 3/2010 | Trantham |
| 2010/0138604 A1 | 6/2010 | Noguchi et al. |
| 2011/0099351 A1* | 4/2011 | Condict ................ G06F 3/0608<br>711/216 |
| 2011/0173484 A1 | 7/2011 | Schuette et al. |
| 2011/0197024 A1 | 8/2011 | Thomas |
| 2011/0246597 A1 | 10/2011 | Swanson et al. |
| 2012/0096309 A1 | 4/2012 | Kumar et al. |
| 2013/0047029 A1 | 2/2013 | Ikeuchi et al. |
| 2013/0067459 A1 | 3/2013 | Sannidhanam et al. |
| 2013/0086006 A1 | 4/2013 | Colgrove |
| 2013/0151683 A1* | 6/2013 | Jain ..................... G06F 3/0611<br>709/223 |
| 2013/0339818 A1* | 12/2013 | Baker .................. G06F 3/0667<br>714/763 |
| 2014/0020083 A1 | 1/2014 | Fetik |
| 2014/0032834 A1 | 1/2014 | Cudak et al. |
| 2014/0059311 A1 | 2/2014 | Oberhofer et al. |
| 2014/0089265 A1 | 3/2014 | Talagala et al. |
| 2014/0089630 A1 | 3/2014 | Pignatelli |
| 2014/0282824 A1 | 9/2014 | Lango et al. |
| 2014/0285917 A1 | 9/2014 | Cudak et al. |
| 2014/0297603 A1 | 10/2014 | Kim et al. |
| 2015/0012775 A1 | 1/2015 | Cudak et al. |
| 2015/0046756 A1 | 2/2015 | Sreekumaran et al. |
| 2015/0058582 A1 | 2/2015 | Baldwin et al. |
| 2015/0095596 A1 | 4/2015 | Yang |
| 2015/0161000 A1 | 6/2015 | Kim et al. |
| 2015/0205657 A1 | 7/2015 | Clark |
| 2015/0205669 A1 | 7/2015 | Sundaram et al. |
| 2015/0220400 A1 | 8/2015 | Resch |
| 2015/0227602 A1* | 8/2015 | Ram ................... G06F 16/2365<br>707/634 |
| 2015/0286545 A1 | 10/2015 | Brown |
| 2015/0355980 A1 | 12/2015 | Volvovski |
| 2016/0013988 A1 | 1/2016 | Andrews |
| 2016/0062674 A1* | 3/2016 | Benight ................ G06F 16/22<br>711/114 |
| 2016/0070652 A1 | 3/2016 | Sundararaman et al. |
| 2016/0077933 A1 | 3/2016 | Ventura et al. |
| 2016/0085630 A1 | 3/2016 | Gardner |
| 2016/0246537 A1 | 8/2016 | Kim |
| 2017/0090767 A1 | 3/2017 | Poston et al. |
| 2017/0099187 A1 | 4/2017 | Dale et al. |
| 2017/0147437 A1 | 5/2017 | Borlick et al. |
| 2017/0160993 A1 | 6/2017 | Fiske et al. |
| 2017/0192865 A1 | 7/2017 | Pan |
| 2017/0192868 A1* | 7/2017 | Vijayan .................. G06F 11/14 |
| 2017/0199893 A1 | 7/2017 | Aronovich et al. |
| 2017/0206034 A1 | 7/2017 | Fetik |
| 2017/0235609 A1 | 8/2017 | Wires et al. |
| 2017/0308436 A1 | 10/2017 | Agombar et al. |
| 2018/0018227 A1 | 1/2018 | Kazi |
| 2018/0018235 A1* | 1/2018 | Arslan ................ G06F 11/1453 |
| 2018/0060894 A1 | 3/2018 | Beveridge et al. |
| 2018/0101305 A1 | 4/2018 | Kazi et al. |
| 2018/0157532 A1 | 6/2018 | Kumar et al. |
| 2018/0165169 A1 | 6/2018 | Camp et al. |
| 2018/0189109 A1 | 7/2018 | Nagai et al. |
| 2018/0205785 A1 | 7/2018 | Caulfield et al. |
| 2018/0217898 A1 | 8/2018 | Tormasov |
| 2018/0260123 A1 | 9/2018 | Andresen et al. |
| 2018/0278597 A1 | 9/2018 | Helms et al. |
| 2018/0284987 A1 | 10/2018 | Lazier |
| 2018/0307560 A1* | 10/2018 | Vishnumolakala ........................<br>G06F 11/1076 |
| 2018/0314607 A1 | 11/2018 | Deshpande et al. |
| 2018/0322558 A1 | 11/2018 | Padmanabh et al. |
| 2018/0356998 A1 | 12/2018 | Wu et al. |
| 2019/0050263 A1 | 2/2019 | Patel et al. |
| 2019/0104398 A1 | 4/2019 | Owen et al. |
| 2019/0108099 A1 | 4/2019 | Mazumdar |
| 2019/0109772 A1 | 4/2019 | Lipstone et al. |
| 2019/0197023 A1 | 6/2019 | Chennamsetty et al. |
| 2019/0332473 A1* | 10/2019 | Yang ..................... H03M 13/356 |
| 2019/0332502 A1 | 10/2019 | Ma et al. |
| 2019/0361850 A1 | 11/2019 | Uno et al. |
| 2019/0379588 A1 | 12/2019 | Rao |
| 2020/0026439 A1 | 1/2020 | Gao et al. |
| 2020/0034257 A1 | 1/2020 | Mahmood et al. |
| 2020/0042388 A1 | 2/2020 | Roberts |
| 2020/0050689 A1 | 2/2020 | Tal et al. |
| 2020/0065191 A1 | 2/2020 | Zhou |
| 2020/0133503 A1 | 4/2020 | Sun et al. |

(56) References Cited

U.S. PATENT DOCUMENTS

| | | |
|---|---|---|
| 2020/0175038 A1 | 6/2020 | Guan et al. |
| 2020/0201837 A1 | 6/2020 | Motwani et al. |
| 2020/0257457 A1 | 8/2020 | Matsugami et al. |

OTHER PUBLICATIONS

"Features—RoboHead"; Project Management Software for Marketing & Creative Teams, Aquent; 2018 (https://www.robohead.net/features) (2 pages).

"Make more time for the work that matters most"; Asana, Inc.; 2017 (https://asana.com/) (5 pages).

"Online Project Management Tools & Features"; ProWorkflow; Jun. 2015 (https://www.proworkflow.com/features-project-management-tools/) (7 pages).

Extended European Search Report issued in corresponding European Application No. 20152195.2, dated Jun. 2, 2020.

\* cited by examiner

METHOD AND SYSTEM FOR INLINE DEDUPLICATION USING ERASURE CODING TO MINIMIZE READ AND WRITE OPERATIONS

BACKGROUND

Computing devices may include any number of internal components such as processors, memory, and persistent storage. Each of the internal components of a computing device may be used to generate data. The process of generating, storing, and backing-up data may utilize computing resources of the computing devices such as processing and storage. The utilization of the aforementioned computing resources to generate backups may impact the overall performance of the computing resources.

SUMMARY

In general, in one aspect, the invention relates to a method for storing data in accordance with one or more embodiments of the invention. The method includes obtaining data, applying an erasure coding procedure to the data to obtain a plurality of data chunks and a parity chunk, deduplicating the plurality of data chunks to obtain a plurality of deduplicated data chunks, storing, across a plurality of nodes, the plurality of deduplicated data chunks and the parity chunk, and tracking location information for each of the plurality of deduplicated data chunks and the parity chunk.

In general, in one aspect, the invention relates to a non-transitory computer readable medium in accordance with one or more embodiments of the invention includes computer readable program code, which when executed by a computer processor enables the computer processor to perform a method for storing data. The method includes obtaining data, applying an erasure coding procedure to the data to obtain a plurality of data chunks and a parity chunk, deduplicating the plurality of data chunks to obtain a plurality of deduplicated data chunks, storing, across a plurality of nodes, the plurality of deduplicated data chunks and the parity chunk, and tracking location information for each of the plurality of deduplicated data chunks and the parity chunk.

In general, in one aspect, the invention relates to a data cluster. The data cluster includes a plurality of data nodes comprising an accelerator pool and a non-accelerator pool, wherein the accelerator pool comprises a data node, and the non-accelerator pool comprises a plurality of data nodes; wherein the data node of the plurality node is programmed to: obtain data, apply an erasure coding procedure to the data to obtain a plurality of data chunks and a parity chunk, deduplicate the plurality of data chunks to obtain a plurality of deduplicated data chunks, store, across a plurality of nodes, the plurality of deduplicated data chunks and the parity chunk, and track location information for each of the plurality of deduplicated data chunks and the parity chunk.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1A:
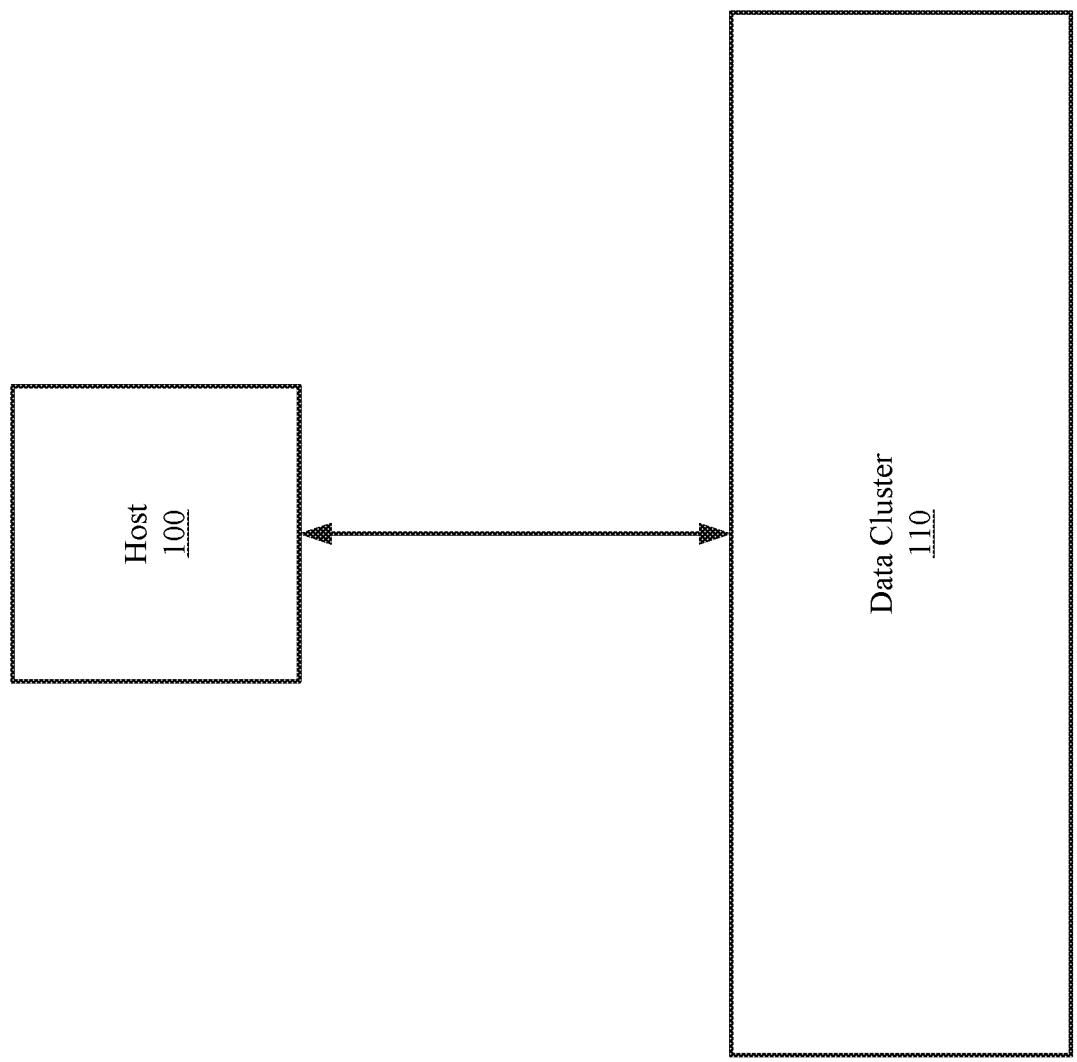
FIG. 1A shows a diagram of a system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

In general, embodiments of the invention relate to a method and system for storing data in a data cluster. Embodiments of the invention may utilize a deduplicator, operating in an accelerator pool, which applies an erasure coding procedure on data obtained from a host to divide the data into data chunks and to generate parity chunks using the data chunks. The deduplicator may then perform deduplication on the data chunks to generate deduplicated data that includes deduplicated data chunks. The deduplicated data chunks and the parity chunks are subsequently distributed to nodes in the data cluster in accordance with an erasure coding procedure.

In one or more embodiments of the invention, the deduplicator stores storage information that specifies the nodes in which each data chunk and parity chunk is stored. In this manner, if the accelerator pool obtains data that include modifications to previously stored data chunks, the modified data chunks may be sent to the appropriate nodes (i.e., the nodes on which prior versions of the specific data chunk or parity chunk are stored). In this manner, embodiments of the invention minimize the number of read and write operations that are required to write erasure coded deduplicated data to the non-accelerator pool. Said another way, by tracking to which node each data chunk and parity chunk is written to in the non-accelerator pool, one or more embodiments of the invention enable only portions of a stripe (i.e., a set of data chunks and parity chunks) to be written to the non-accelerator pool when a portion of the stripe is modified. These results in fewer read and write operations being performed as none of the prior stored data chunks need to be read from or re-written to the non-accelerator pool.

FIG. 1A shows an example system in accordance with one or more embodiments of the invention. The system includes a host (100) and a data cluster (110). The host (100) is operably connected to the data cluster (110) via any combination of wired and/or wireless connections.

In one or more embodiments of the invention, the host (100) utilizes the data cluster (110) to store data. The data stored may be backups of databases, files, applications, and/or other types of data without departing from the invention.

Figure 4:
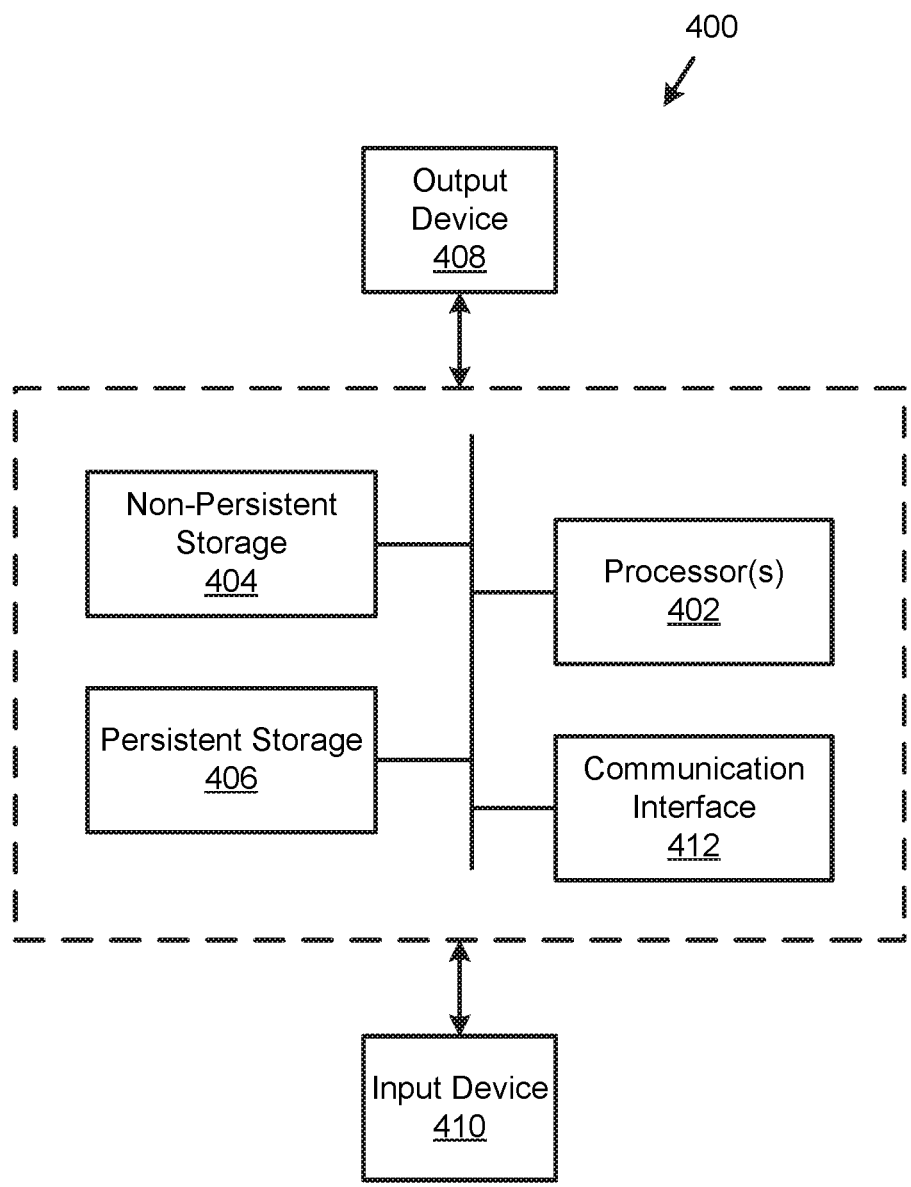
FIG. 4 shows a diagram of a computing device in accordance with one or more embodiments of the invention.

In one or more embodiments of the invention, the host (100) is implemented as a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the host (100) described throughout this application.

In one or more embodiments of the invention, the host (100) is implemented as a logical device. The logical device may utilize the computing resources of any number of computing devices and thereby provide the functionality of the host (100) described throughout this application.

In one or more embodiments of the invention, the data cluster (110) stores data and/or backups of data generated by the host (100). The data and/or backups may be deduplicated versions of data obtained from the host. The data cluster may, via an erasure coding procedure, store portions of the deduplicated data across the nodes operating in the data cluster (110).

As used herein, deduplication refers to methods of storing only portions of files (also referred to as file segments or segments) that are not already stored in persistent storage. For example, when multiple versions of a large file, having only minimal differences between each of the versions, are stored without deduplication, storing each version will require approximately the same amount of storage space of a persistent storage. In contrast, when the multiple versions of the large file are stored with deduplication, only the first version of the multiple versions stored will require a substantial amount of storage. Once the first version is stored in the persistent storage, the subsequent versions of the large file subsequently stored will be de-duplicated before being stored in the persistent storage resulting in much less storage space of the persistent storage being required to store the subsequently stored versions when compared to the amount of storage space of the persistent storage required to store the first stored version.

Continuing with the discussion of FIG. 1A, the data cluster (110) may include nodes that each store any number of portions of data. The portions of data may be obtained by other nodes or obtained from the host (100). For additional details regarding the data cluster (110), see, e.g., FIG. 1B.

Figure 1B:
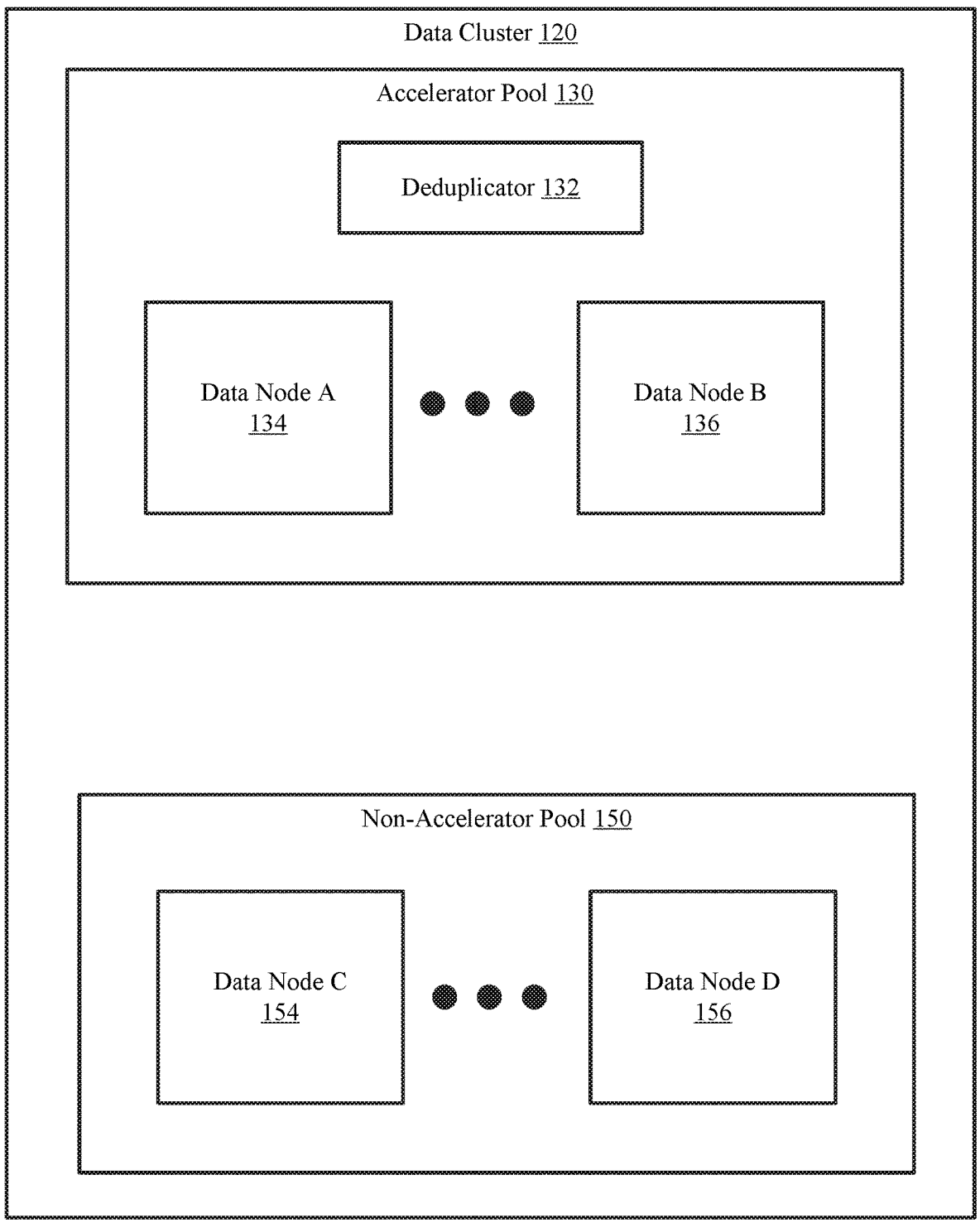
FIG. 1B shows a diagram of a data cluster in accordance with one or more embodiments of the invention.

FIG. 1B shows a diagram of a data cluster (120) in accordance with one or more embodiments of the invention. The data cluster (120) may be an embodiment of the data cluster (110, FIG. 1A) discussed above. The data cluster (120) may include an accelerator pool (130) and a non-accelerator pool (150). The accelerator pool (130) may include a deduplicator(s) (132) and any number of data nodes (134, 136). Similarly, the non-accelerator pool (150) includes any number of data nodes (154, 156). The components of the data cluster (120) may be operably connected via any combination of wired and/or wireless connections. Each of the aforementioned components is discussed below.

In one or more embodiments of the invention, the deduplicator(s) (132) is a device that includes functionality to perform deduplication on data obtained from a host (e.g., 100, FIG. 1A). The deduplicator (132) may store information useful to perform the aforementioned functionality. The information may include deduplication identifiers (D-IDs). A D-ID is a unique identifier that identifies portions of the data (also referred to as data chunks) that are stored in the data cluster (120). The D-ID may be used to determine whether a data chunk of the obtained data is already present elsewhere in the accelerator pool (140) or the non-accelerator pool (150). The deduplicator (132) may use the information to perform the deduplication and generate deduplicated data (or a deduplicated backup). After deduplication, an erasure coding procedure may be performed on the deduplicated data in order to generate parity chunks. The deduplicator (132) may perform the deduplication and erasure coding procedure via the method illustrated in FIG. 2

Figure 2:
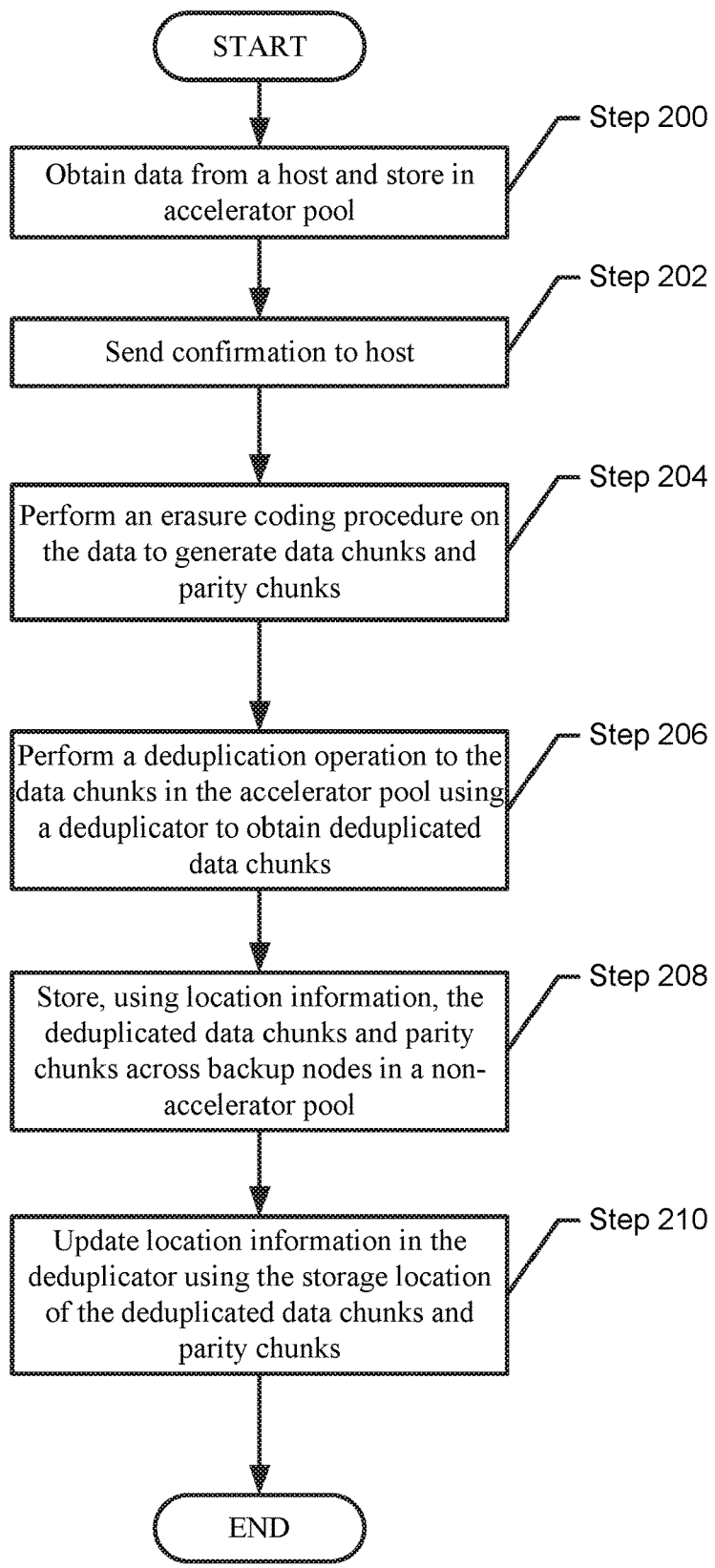
FIG. 2 shows a flowchart for storing data in a data cluster in accordance with one or more embodiments of the invention.

In one or more of embodiments of the invention, the deduplicator (132) is implemented as computer instructions, e.g., computer code, stored on a persistent storage that when executed by a processor of a data node (e.g., 134, 136) of the accelerator pool (140) cause the data node to provide the aforementioned functionality of the deduplicator (132) described throughout this application and/or all, or a portion thereof, of the method illustrated in FIG. 2.

In one or more embodiments of the invention, the deduplicator (132) is implemented as a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the deduplicator (132) described throughout this application and/or all, or a portion thereof, of the method illustrated in FIG. 2.

In one or more embodiments of the invention, the deduplicator (132) is implemented as a logical device. The logical device may utilize the computing resources of any number of computing devices and thereby provide the functionality of the deduplicator (132) described throughout this application and/or all, or a portion thereof, of the method illustrated in FIG. 2.

Continuing with the discussion of FIG. 1B, different data nodes in the cluster may include different quantities and/or types of computing resources, e.g., processors providing processing resources, memory providing memory resources, storages providing storage resources, communicators providing communications resources. Thus, the system may include a heterogeneous population of nodes.

The heterogeneous population of nodes may be logically divided into an accelerator pool (130) including nodes that have more computing resources, e.g., high performance nodes (134, 136) than other nodes and a non-accelerator pool (150) including nodes that have fewer computing resources, e.g., low performance nodes (154, 156) than the nodes in the accelerator pool (130). For example, nodes of the accelerator pool (130) may include enterprise class solid state storage resources that provide very high storage bandwidth, low latency, and high input-outputs per second (IOPS). In contrast, the nodes of the non-accelerator pool (150) may include hard disk drives that provide lower storage performance. While illustrated in FIG. 1B as being divided into two groups, the nodes may be divided into any number of groupings based on the relative performance level of each node without departing from the invention.

In one or more embodiments of the invention, the data nodes (134, 136, 154, 156) store data chunks and parity chunks. The data nodes (134, 136, 154, 156) may include persistent storage that may be used to store the data chunks and parity chunks. The generation of the data chunks and parity chunks is described below with respect to FIG. 2.

In one or more embodiments of the invention, the non-accelerator pool (150) includes any number of fault domains. In one or more embodiments of the invention, a fault domain is a logical grouping of nodes (e.g., data nodes) that, when one node of the logical grouping of nodes goes offline and/or otherwise becomes inaccessible, the other nodes in the logical grouping of nodes are directly affected. The effect of the node going offline to the other nodes may include the other nodes also going offline and/or otherwise inaccessible. The non-accelerator pool (150) may include multiple fault domains. In this manner, the events of one fault domain in the non-accelerator pool (150) may have no effect to other fault domains in the non-accelerator pool (150).

For example, two data nodes may be in a first fault domain. If one of these data nodes in the first fault domain experiences an unexpected shutdown, other nodes in the first fault domain may be affected. In contrast, another data node in the second fault domain may not be affected by the unexpected shutdown of a data node in the first fault domain. In one or more embodiments of the invention, the unexpected shutdown of one fault domain does not affect the nodes of other fault domains. In this manner, data may be replicated and stored across multiple fault domains to allow high availability of the data.

In one or more embodiments of the invention, each data node (134, 136, 154, 156) is implemented as a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the data node (134, 136, 154, 156) described throughout this application and/or all, or a portion thereof, of the method illustrated in FIG. 2.

In one or more embodiments of the invention, the data nodes (134, 136, 154, 156) are implemented as a logical device. The logical device may utilize the computing resources of any number of computing devices and thereby provide the functionality of the data nodes (134, 136, 154, 156) described throughout this application and/or all, or a portion thereof, of the method illustrated in FIG. 2.

FIG. 2 shows a flowchart for storing data in a data cluster in accordance with one or more embodiments of the invention. The method shown in FIG. 2 may be performed by, for example, a deduplicator (132, FIG. 1B). Other components of the system illustrated in FIG. 1B may perform the method of FIG. 2 without departing from the invention. While the various steps in the flowchart are presented and described sequentially, one of ordinary skill in the relevant art will appreciate that some or all of the steps may be executed in different orders, may be combined or omitted, and some or all steps may be executed in parallel.

In step 200, data is obtained from a host. The data may be a file, a file segment, a collection of files, or any other type of data without departing from the invention. data cluster. The data may be obtained in response to a request to store data and/or backup the data. Other requests may be used to initiate the method without departing from the invention.

In step 202, confirmation is sent to the host. In one or more embodiments of the invention, the confirmation is an acknowledgement (ACK) that confirms receipt of the data by the data cluster. At this stage, from the perspective of the host, the data has been backed up. This is the case even though data cluster is still performing the method shown in FIG. 2.

In step 204, an erasure coding procedure is performed on the data to generate data chunks and parity chunks. In one or more embodiments of the invention, the erasure coding procedure includes dividing the obtained data into portions, referred to as data chunks. Each data chunk may include any number of data segments associated with the obtained data. The individual data chunks may then be combined (or otherwise grouped) into stripes (also referred to as Redundant Array of Independent Disks (RAID) stripes). One or more parity values are then calculated for each of the aforementioned stripes. The number of parity stripes may vary based on the erasure coding algorithm that is being used as part of the erasure coding procedure. Non-limiting examples of erasure coding algorithms are RAID-4, RAID-5, and RAID-6. Other erasing coding algorithms may be used without departing from the invention. Continuing with the above discussion, if the erasing code procedure is implementing RAID 4, then a single parity value is calculated. The resulting parity value is then stored in a parity chunk. If erasure coding procedure algorithm requires multiple parity values to be calculated, then the multiple parity values are calculated with each parity value being stored in a separate data chunk.

As discussed above, the data chunks are used to generate parity chunks in accordance with the erasure coding procedure. More specifically, the parity chunks may be generated by applying a predetermined function (e.g., P Parity function, Q Parity Function), operation, or calculation to at least one of the data chunks. Depending on the erasure coding procedure used, the parity chunks may include, but are not limited to, P parity values and/or Q parity values.

In one embodiment of the invention, the P parity value is a Reed-Solomon syndrome and, as such, the P Parity function may correspond to any function that can generate a Reed-Solomon syndrome. In one embodiment of the invention, the P parity function is an XOR function.

In one embodiment of the invention, the Q parity value is a Reed-Solomon syndrome and, as such, the Q Parity function may correspond to any function that can generate a Reed-Solomon syndrome. In one embodiment of the invention, a Q parity value is a Reed-Solomon code. In one embodiment of the invention, $Q = g_0 \cdot D_0 + g_1 \cdot D_1 + g_2 D_2 + \ldots + g_{n-1} \cdot D_{n-1}$, where Q corresponds to the Q parity, g is a generator of the field, and the value of D corresponds to the data in the data chunks.

In one or more embodiments of the invention, the number of data chunks and parity chunks generated is determined by the erasure coding procedure, which may be specified by the host, by the data cluster, and/or by another entity.

In step 206, deduplication is performed on the data chunks to obtain deduplicated data chunks. In one or more embodiments of the invention, the deduplication is performed in the accelerator pool by identifying the data chunks of the obtained data and assigning a fingerprint to each data chunk. A fingerprint is a unique identifier (e.g., a D-ID) that may be stored in metadata of the data chunk. The deduplicator performing the deduplication may generate a fingerprint for a data chunk and identify whether the fingerprint matches an existing fingerprint stored in the deduplicator. If the fingerprint matches an existing fingerprint, the data chunk may be deleted, as it is already stored in the data cluster. If the fingerprint does not match any existing fingerprints, the data chunk may be stored as a deduplicated data chunk. Additionally, the fingerprint is stored in the deduplicator for deduplication purposes of future obtained data.

In one or more embodiments of the invention, the deduplicated data chunks collectively make up the deduplicated data. In one or more embodiments of the invention, the deduplicated data chunks are the data chunks that were not deleted during deduplication.

In step 208, the deduplicated data chunks and parity chunks are stored across data nodes in different fault domains in a non-accelerator pool. As discussed above, the deduplicated data chunks and the parity chunks are stored in a manner that minimizes reads and writes from the non-accelerator pool. In one embodiment of the invention, this minimization is achieved by storing data chunks and parity chunks, which are collectively referred to as a stripe, in the same manner as a prior version of the stripe. The deduplicator may use, as appropriate, location information for the previously stored data chunks and parity chunks to determine where to store the data chunks and parity chunks in step 208.

More specifically, in one embodiment of the invention, if the deduplicated data chunks and parity chunks are the first version of a stripe (as opposed to a modification to an existing/previously stored stripe), then the deduplicated data chunks and parity chunks may be stored across the nodes (each in a different fault domain) in the non-accelerator pool. The location (or in this case the specific node) in which the data chunk or parity chunk is stored is tracked by the deduplicator. The scenario does not require the deduplicator to use location information for previously stored data chunks and parity chunks.

However, if the deduplicated data chunks and parity chunks are the second version of a stripe (e.g., a modification to a previously stored stripe), then the deduplicated data chunks and parity chunks are stored across the nodes (each in a different fault domain) in the non-accelerator pool using prior stored location information. The location (or in this case the specific node and/or fault domain) in which the data chunk or parity chunk is stored is tracked by the deduplicator.

For example, consider a scenario in which the first version of the stripe includes three data chunks (D1, D2, D3) and one parity chunk (P1) and that they were stored as follows: Node 1 stores D1, Node 2 stores D2, Node 3 stores D3, and Node 4 stores P1. Further, in this example, a second version of the stripe is received that includes three data chunks (D1, D2', D3) and one newly calculated parity chunk (P1'). After deduplication only D2' and P1' need to be stored. Based on the prior storage locations (also referred to as locations) of the data chunks (D1, D2, and D3) and parity chunks (P1) for the first version of the stripe, D2' is stored on Node 2 and P1' is stored on Node 4. By storing the D2' on Node 2 and P1' on Node 4 the data chunks and parity chunks associated with the second stripe satisfy the condition that all data chunks and parity chunks for the second version of the stripe are being stored in separate fault domains. If the location information was not taken into account, then the entire stripe (i.e., D1, D2', D3, and P1') would need to be stored in order to guarantee that the requirement that all data chunks and parity chunks for the second version of the stripe are being stored in separate fault domains is satisfied.

In one or more embodiments of the invention, if the data node that obtains the deduplicated data chunk, which is a modified version of a prior stored deduplicated data chunk, then the data node may: (i) store the modified version of the deduplicated data chunk (i.e., the data node would include two versions of the data chunk) or (ii) store the modified version of the deduplicated data chunk and delete the prior version of the deduplicated data chunk.

In one embodiment of the invention, the deduplicator includes functionality to determine whether a given data chunk is a modified version of a previously stored data chunk. Said another way, after the data is received from a host divided into data chunks and grouped into stripes, the deduplicator includes functionality to determine whether a stripe is a modified version of a prior stored stripe. The deduplicator may use the fingerprints of the data chunks within the stripe to determine whether the stripe is a modified version of a prior stored stripe. Other methods for determining whether a data chunk is a modified version of a prior stored data chunk and/or whether a stripe is a modified version of a prior stripe without departing from the invention.

In step 210, location information in the deduplicator is updated using the location of the deduplicated data chunks and parity chunks. The location (or location) may be specified using a node identifier, a fault domain identifier (i.e., the fault domain in which the node storing the data chunk or parity chunk is located), or any other type of identifying information. The location information may be stored along with other chunk metadata, which may include, but is not limited to, a chunk type (e.g., data chunk or parity chunk), a deduplicated data chunk identifier (e.g., a D-ID) or parity chunk identifier (which may be generated for a parity chunk in the same manner as a D-ID for a data chunk), and the erasure coding information (e.g., information about the erasure code procedure, e.g., the erasure coding algorithm).

As discussed above, the data chunks and parity chunks may be stored in different fault domains. Storing the data chunks and parity chunks in multiple fault domains may be for recovery purposes. In the event that one or more fault domains storing data chunks or parity chunks become inaccessible, the data chunks and/or parity chunks stored in the remaining fault domains may be used to recreate the inaccessible data. In one embodiment of the invention, as part of (or in addition to) the chunk metadata, the deduplicator (or other computing device or logical device) tracks the members of each stripe (i.e., which data chunks and which parity chunks are part of a stripe). This information may be used to aid in any recover operation that is required to be performed on the data stored in the data cluster.

In one embodiment of the invention, the data that is originally obtained in step 200 and/or the deduplicated chunks obtained in step 206 may be: (i) stored on a node in the accelerator pool for a finite period of time (e.g., until it is determined that this data is no longer required in the accelerator pool, where this determination may be made based on a policy); (ii) stored on a node in the accelerator pool until the end of the step 208 and then deleted from the accelerator pool.

EXAMPLE

Figure 3A:
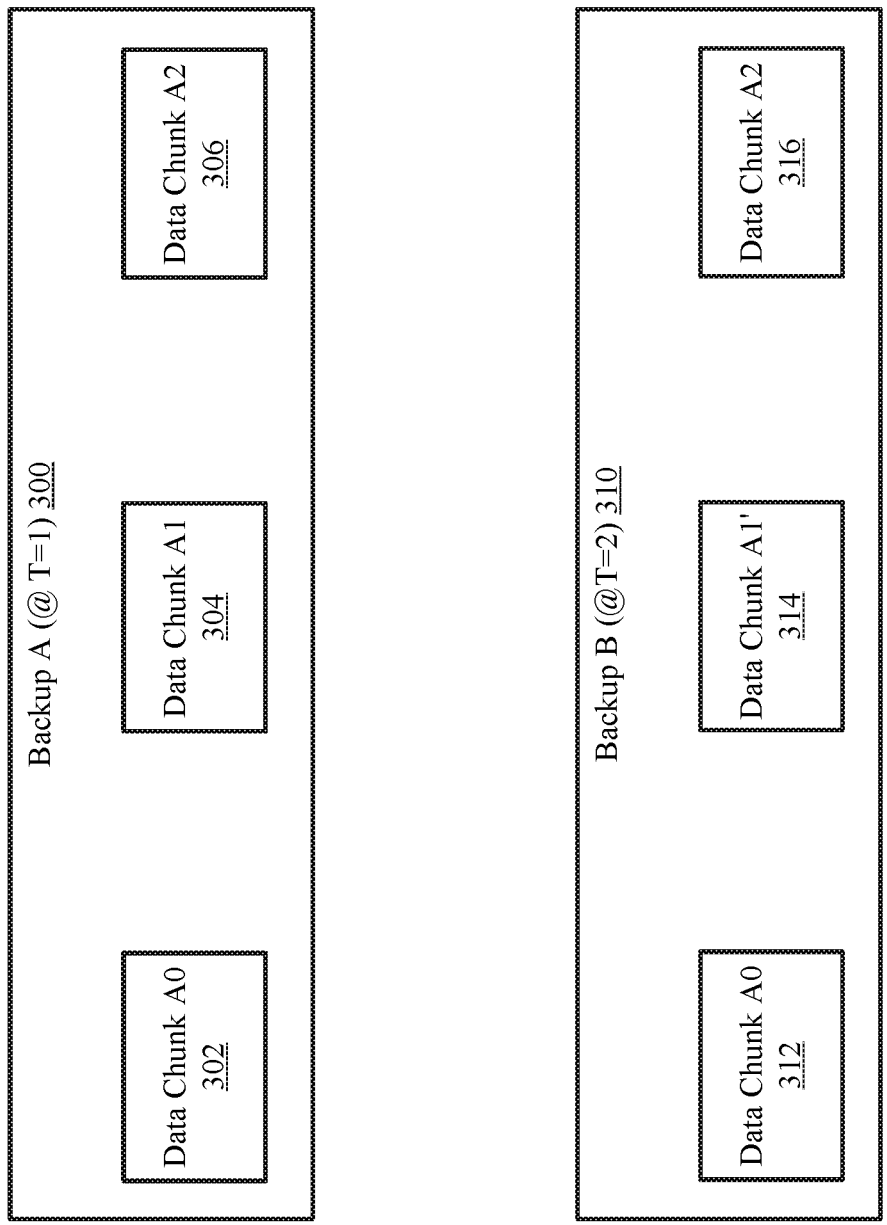
FIGS. 3A-3C show an example in accordance with one or more embodiments of the invention.
Figure 3B:
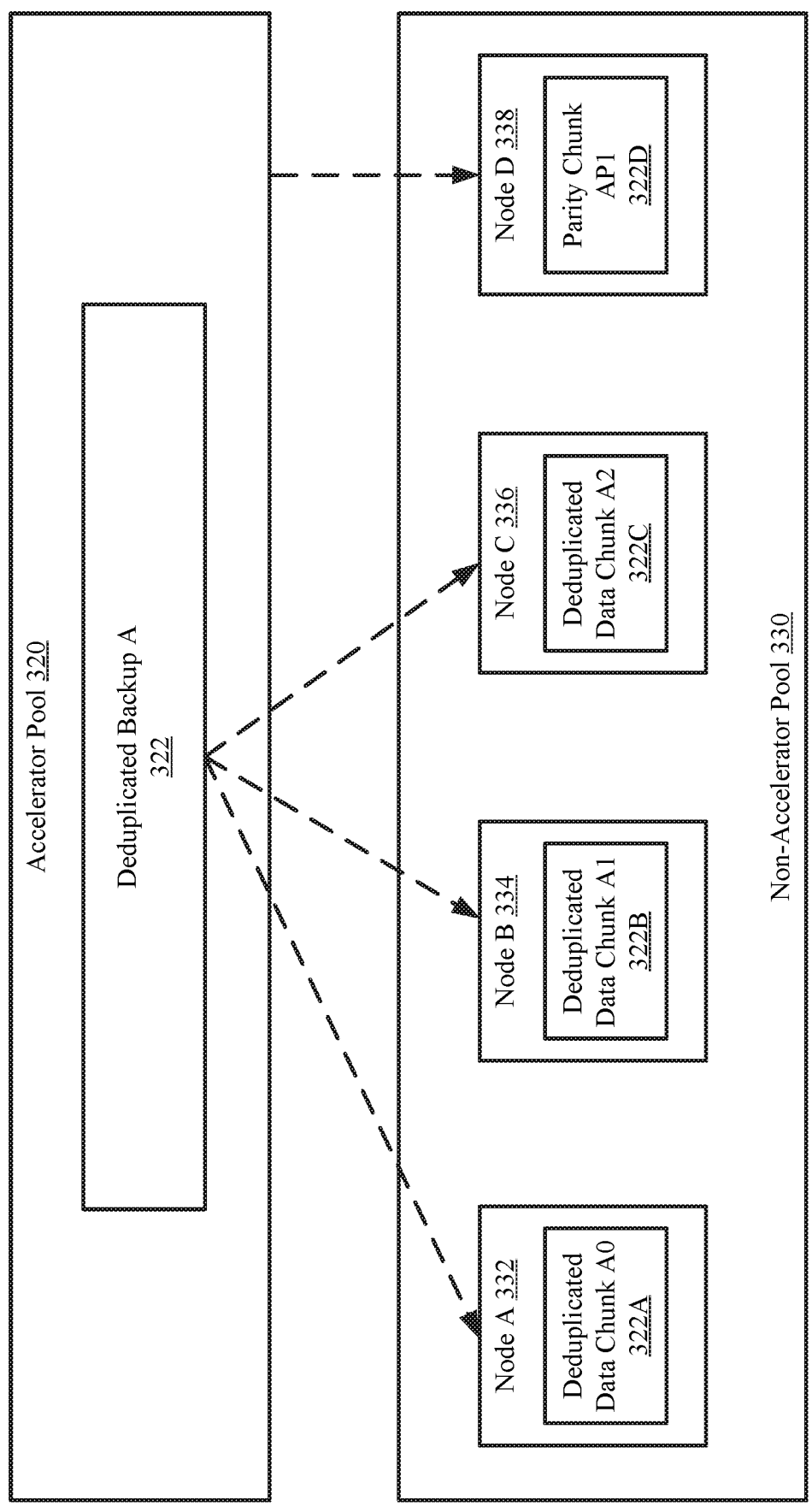
Figure 3C:
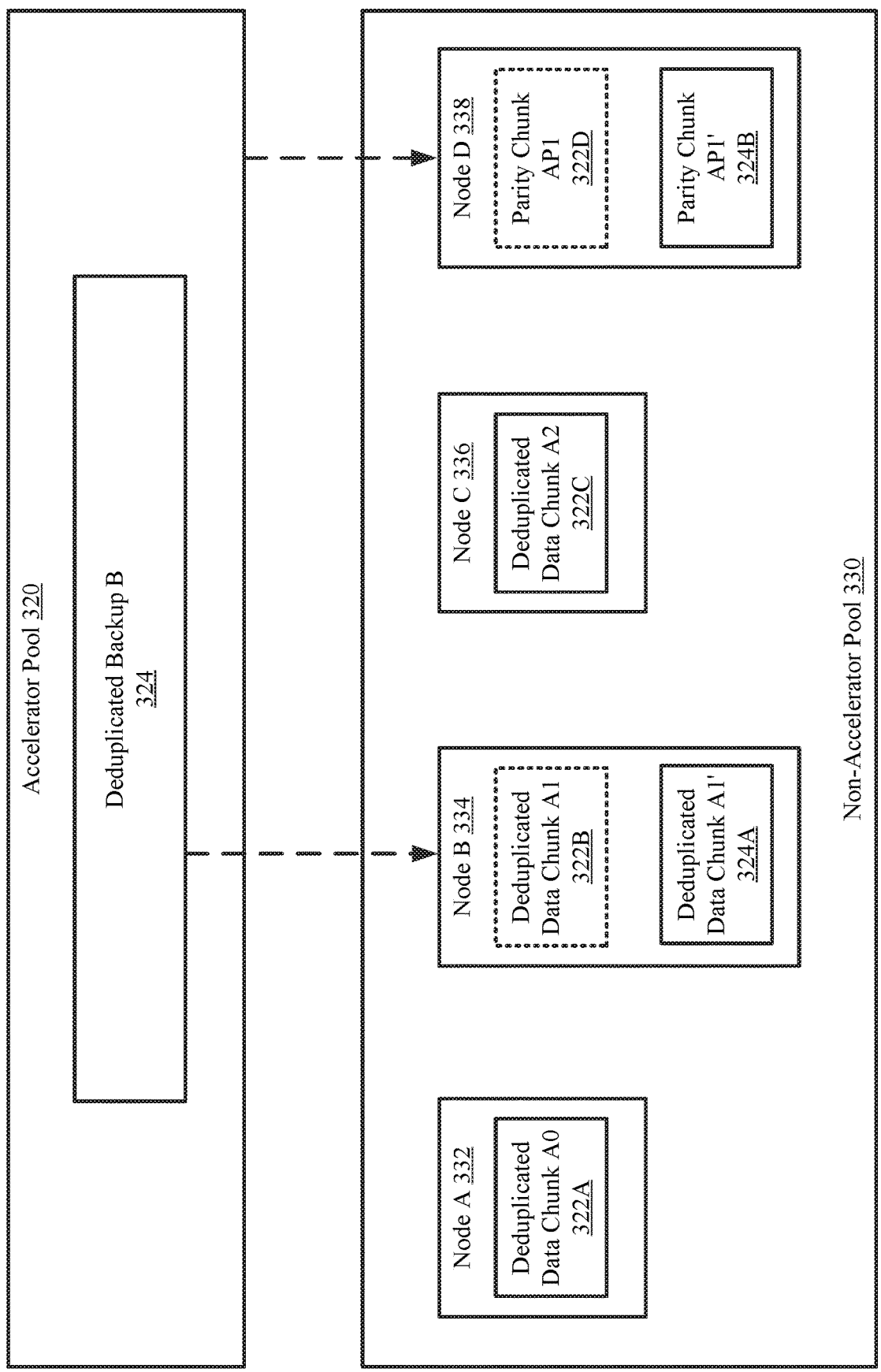

The following section describes an example. The example is not intended to limit the invention. The example is illustrated in FIGS. 3A-3C. Turning to the example, consider a scenario in which a data cluster obtains two backups from a single host at two points in time. The host may request the backups be stored in the data cluster in a 3:1 erasure coding scheme. FIG. 3A shows a diagram of the two backups at the two points in time. Backup A (300) may be obtained at a point in time T=1. Backup A (300) includes data that may be divided into data chunks A0 (302), A1 (304), and A2 (306). At a second point in time T=2, the data cluster obtains a second backup (310) that includes data that may be divided into data chunks A0 (312), A1' (314), and A3 (316).

In this example, Backup B is a modified version of Backup A. Accordingly, assume that the data associated with data chunk A0 (312) of backup B (310) is identical to the data associated with data chunk A0 (302) of backup A (300). Similarly, the data associated with data chunk A2 (316) of backup B (310) is identical to the data associated with data chunk A2 (306) of backup A (300). In contrast, the data associated with data chunk A1' (314) of backup B (310) is an update of data chunk A1 (304) of backup A (300). Finally, in this example, assume that the erasure coding process includes implementing RAID 4.

FIG. 3B shows the data cluster after backup A (300) is processed in accordance with FIG. 2. The data cluster may include an accelerator pool (320) that performs the method of FIG. 2 to generate deduplicated backup A (322) using backup A (300). The method may include dividing the backup into data chunks A0, A1, and A2, where these data chunks are associated with a first stripe. The aforementioned data chunks are then used to generate a parity chunk AP1 using RAID 3.

Because the deduplicated backup A (322) is the first backup stored in the data cluster, all three data chunks are distributed across nodes in the non-accelerator pool (330) as deduplicated data chunks (322A, 322B, 322C). Deduplicated data chunk A0 (322A) may be stored in a node A (332), deduplicated data chunk A1 (322B) may be stored in a node B (334), deduplicated data chunk A2 (322C) may be stored in a node C (336), and parity chunk AP1 (322D) may be stored in a node D (338). Each node (332, 334, 336, 338) may be a node in a unique fault domain. In this manner, each chunk (322A, 322B, 322C, 322D) is stored in a different fault domain.

The location of each deduplicated data chunk (322A, 322B, 322C) and parity chunk (322D) is stored in the deduplicator of the accelerator pool (320) as location information. The location information may include entries that each specify a deduplicated data chunk (322A, 322B, 322C) or the parity chunk AP1 (322D) and the data node (332, 334, 336, 338) storing the respective chunk.

At the second point in time T=2, backup B (310) is obtained by the accelerator pool (320). The backup B (310) may be divided into data chunks A0, A1', and A2, where these data chunks are associated with a second stripe that is a modified version of the first stripe. The data chunks (A0, A1', A2) may be used to generate a parity chunk AP1'. The data chunks in the second stripe are then deduplicated by the deduplicator. The result of the deduplication of the second stripe is that data chunks A0 and A2 exist in the non-accelerator pool and thus are deleted from the backup B.

The remaining chunks associated with the deduplicated backup B (324) may be stored in nodes of the non-accelerator pool (330) as deduplicated data chunks A1' (324A) and AP1' (324B). The accelerator pool (320) may use the location information, which specifies the location information of deduplicated data chunks (322A, 322B, 322C) and parity chunk (322D) of deduplicated backup A (322), to determine where to store the deduplicated data chunk (324A) and parity chunk (324B) of deduplicated backup B (324).

Using the location information, deduplicated data chunk A1' (324A) is stored in node B (334), where deduplicated data chunk A1 (322B) is stored. Subsequently, deduplicated data chunk A1 (322B) may be deleted from node B (334). Similarly, parity chunk AP1' (324B) is stored in node D (338). Further, parity chunk AP1 (322D) may be deleted from node D (338).

END OF EXAMPLE

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

One or more embodiments of the invention may be implemented using instructions executed by one or more processors of the data management device. Further, such instructions may correspond to computer readable instructions that are stored on one or more non-transitory computer readable mediums.

One or more embodiments of the invention may improve the operation of one or more computing devices. More specifically, embodiments of the invention improve the efficiency of performing storage operations in a data cluster. The efficiency is improved by implementing erasure coding procedures and performing deduplication on data. The erasure coding procedure includes generating additional portions of data associated with the data. The deduplicated data and the additional portions of data may be stored across multiple fault domains. In this manner, if any number of fault domains become inaccessible prior to recovery of data, the data stored in the remaining fault domains may be used to recreate the data. This method may replace the need to store multiple copies of the same data across the fault domains, thus reducing the amount of storage used for storing data while maintaining policies in the event of fault domain failures.

Further, embodiments of the invention improve the storage and recovery operations by tracking the location of each portion of data (e.g., data chunks and parity chunks) stored in the data cluster. By monitoring tracking the location, embodiments of the invention may be used to send deduplicated data chunks and/or parity chunks to appropriate data nodes.

Thus, embodiments of the invention may address the problem of inefficient use of computing resources. This problem arises due to the technological nature of the environment in which data storage operations are performed.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for storing data, the method comprising:
  obtaining first data;
  applying an erasure coding procedure to the first data to obtain a first plurality of data chunks and a first parity chunk, wherein each of the first plurality of data chunks corresponds to a portion of the first data, wherein the first parity chunk is generated using the first plurality of data chunks;
  deduplicating the first plurality of data chunks to obtain a first plurality of deduplicated data chunks, wherein the first parity chunk is not deduplicated;
  storing, across a plurality of first nodes of a plurality of nodes, the first plurality of deduplicated data chunks and the first parity chunk, wherein each of a plurality of fault domains comprises at least one of the plurality of first nodes, wherein each of the first plurality of deduplicated data chunks and the first parity chunk are stored in a different one of the plurality of fault domains; and
  tracking location information for each of the first plurality of deduplicated data chunks and the first parity chunk, wherein the location information specifies in which of the plurality of fault domains each of the first plurality of deduplicated data chunks is stored and wherein the location information specifies in which of the plurality of fault domains the first parity chunk is stored;
  obtaining second data;
  applying the erasure coding procedure to the second data to obtain a second plurality of data chunks and a second parity chunk;
  deduplicating the second plurality of data chunks to obtain a second plurality of deduplicated data chunks;
  storing, across the plurality of first nodes and using the location information for at least one of the first plurality of deduplicated data chunks, the second plurality of deduplicated data chunks and the second parity chunk;
  wherein a first deduplicated data chunk of the first plurality of deduplicated data chunks is stored in a node of the plurality of first nodes,
  wherein a second deduplicated data chunk of the second plurality of deduplicated data chunks is a modified version of the first deduplicated data chunk,
  wherein storing, across the plurality of first nodes and using the location information for at least one of the first plurality of deduplicated data chunks, the second plurality of deduplicated data chunks and the second parity chunk comprises storing the second deduplicated data chunk on the node of the plurality of first nodes,
  wherein the erasure coding procedure is applied by a deduplicator executing on a second node in an accelerator pool, wherein the second node is one of the plurality of nodes, wherein the plurality of first nodes is located in a non-accelerator pool, and wherein a data cluster comprises the accelerator pool and the non-accelerator pool,
  wherein each of the plurality of nodes comprises a plurality of computing resources for processing and storing data stored in each of the plurality of nodes including the first plurality of deduplicated data chunks, the second plurality of deduplicated data chunks, the first parity chunk, and the second parity chunk,
  wherein the second node in the accelerator pool comprises more of the plurality of computing resources than each of the plurality of first nodes stored in the non-accelerator pool, and
  wherein all nodes, among the plurality of nodes and including the second node on which the deduplicator is executing, stored in the accelerator pool have more of the plurality of computing resources than all nodes, among the plurality of nodes and including the plurality of first nodes, stored in the non-accelerator pool.

2. The method of claim 1,
wherein the first plurality of data chunks and the first parity chunk are associated with a first stripe;
wherein the second plurality of data chunks and the second parity chunk is associated with a second stripe, wherein the second stripe is a modified version of the first stripe,
wherein storing, across the plurality of first nodes and using the location information for at least one of the first plurality of deduplicated data chunks, the second plurality of deduplicated data chunks and the second parity chunk further comprises storing the first parity chunk and the second parity chunk on another node of the plurality of first nodes.

3. The method of claim 1, wherein the first parity chunk comprises a P parity value.

4. The method of claim 1, wherein deduplicating the first plurality of data chunks to obtain the first plurality of deduplicated data chunks is performed after a parity value for the first plurality of data chunks is calculated.

5. A non-transitory computer readable medium comprising computer readable program code, which when executed by a computer processor enables the computer processor to perform a method for storing data, the method comprising:
obtaining first data;
applying an erasure coding procedure to the first data to obtain a first plurality of data chunks and a first parity chunk, wherein each of the first plurality of data chunks corresponds to a portion of the first data, wherein the first parity chunk is generated using the first plurality of data chunks;
deduplicating the first plurality of data chunks to obtain a first plurality of deduplicated data chunks, wherein the first parity chunk is not deduplicated;
storing, across a plurality of first nodes of a plurality of nodes, the first plurality of deduplicated data chunks and the first parity chunk, wherein each of a plurality of fault domains comprises at least one of the plurality of first nodes, wherein each of the first plurality of deduplicated data chunks and the first parity chunk are stored in a different one of the plurality of fault domains; and
tracking location information for each of the first plurality of deduplicated data chunks and the first parity chunk, wherein the location information specifies in which of the plurality of fault domains each of the first plurality of deduplicated data chunks is stored and wherein the location information specifies in which of the plurality of fault domains the first parity chunk is stored;
obtaining second data;
applying the erasure coding procedure to the second data to obtain a second plurality of data chunks and a second parity chunk;
deduplicating the second plurality of data chunks to obtain a second plurality of deduplicated data chunks;
storing, across the plurality of first nodes and using the location information for at least one of the first plurality of deduplicated data chunks, the second plurality of deduplicated data chunks and the second parity chunk;
wherein a first deduplicated data chunk of the first plurality of deduplicated data chunks is stored in a node of the plurality of first nodes,
wherein a second deduplicated data chunk of the second plurality of deduplicated data chunks is a modified version of the first deduplicated data chunk,
wherein storing, across the plurality of first nodes and using the location information for at least one of the first plurality of deduplicated data chunks, the second plurality of deduplicated data chunks and the second parity chunk comprises storing the second deduplicated data chunk on the node of the plurality of first nodes,
wherein the erasure coding procedure is applied by a deduplicator executing on a second node in an accelerator pool, wherein the second node is one of the plurality of nodes, wherein the plurality of first nodes is located in a non-accelerator pool, and wherein a data cluster comprises the accelerator pool and the non-accelerator pool,
wherein each of the plurality of nodes comprises a plurality of computing resources for processing and storing data stored in each of the plurality of nodes including the first plurality of deduplicated data chunks, second plurality of deduplicated data chunks, the first parity chunk, and the second parity chunk,
wherein the second node in the accelerator pool comprises more of the plurality of computing resources than each of the plurality of first nodes stored in the non-accelerator pool, and
wherein all nodes, among the plurality of nodes and including the second node on which the deduplicator is executing, stored in the accelerator pool have more of the plurality of computing resources than all nodes, among the plurality of nodes and including the plurality of first nodes, stored in the non-accelerator pool.

6. The non-transitory computer readable medium of claim 5,
wherein the first plurality of data chunks and the first parity chunk are associated with a first stripe;
wherein the second plurality of data chunks and the second parity chunk is associated with a second stripe, wherein the second stripe is a modified version of the first stripe,
wherein storing, across the plurality of first nodes and using the location information for at least one of the first plurality of deduplicated data chunks, the second plurality of deduplicated data chunks and the second parity chunk further comprises storing the first parity chunk and the second parity chunk on another node of the plurality of first nodes.

7. The non-transitory computer readable medium of claim 5, wherein the first parity chunk comprises a P parity value.

8. The non-transitory computer readable medium of claim 5, wherein deduplicating the first plurality of data chunks to obtain the first plurality of deduplicated data chunks is performed after a parity value for the first plurality of data chunks is calculated.

9. A data cluster, comprising:
an accelerator pool and a non-accelerator pool, wherein the accelerator pool comprises a second node of a plurality of nodes, and the non-accelerator pool comprises a plurality of first nodes of the plurality of nodes;
wherein the second node is programmed to:
obtain first data;
apply an erasure coding procedure to the first data to obtain a first plurality of data chunks and a first parity chunk, wherein each of the first plurality of data chunks corresponds to a portion of the first data, wherein the first parity chunk is generated using the first plurality of data chunks;
deduplicate the first plurality of data chunks to obtain a first plurality of deduplicated data chunks, wherein the first parity chunk is not deduplicated;
store, across the plurality of first nodes, the first plurality of deduplicated data chunks and the first parity chunk, wherein each of a plurality of fault domains comprises at least one of the plurality of first nodes, wherein each of the first plurality of deduplicated data chunks and the first parity chunk are stored in a different one of the plurality of fault domains; and track location information for each of the first plurality of deduplicated data chunks and the first parity chunk, wherein the location information specifies in which of the plurality of fault domains each of the first plurality of deduplicated data chunks is stored and wherein the location information specifies in which of the plurality of fault domains the first parity chunk is stored; track obtain second data;

apply the erasure coding procedure to the second data to obtain a second plurality of data chunks and a second parity chunk;

deduplicate the second plurality of data chunks to obtain a second plurality of deduplicated data chunks;

store, across the plurality of first nodes and using the location information for at least one of the first plurality of deduplicated data chunks, the second plurality of deduplicated data chunks and the second parity chunk;

wherein a first deduplicated data chunk of the first plurality of deduplicated data chunks is stored in a node of the plurality of first nodes, wherein a second deduplicated data chunk of the second plurality of deduplicated data chunks is a modified version of the first deduplicated data chunk, wherein storing, across the plurality of first nodes and using the location information for at least one of the first plurality of deduplicated data chunks, the second plurality of deduplicated data chunks and the second parity chunk comprises storing the second deduplicated data chunk on the node of the plurality of first nodes, wherein the erasure coding procedure is applied by a deduplicator executing on the second node in the accelerator pool, wherein each of the plurality of nodes comprises a plurality of computing resources for processing and storing data stored in each of the plurality of nodes including the first plurality of deduplicated data chunks, second plurality of deduplicated data chunks, the first parity chunk, and the second parity chunk, wherein the second node in the accelerator pool comprises more of the plurality of computing resources than each of the plurality of first nodes stored in the non-accelerator pool, and wherein all nodes, among the plurality of nodes and including the second node on which the deduplicator is executing, stored in the accelerator pool have more of the plurality of computing resources than all nodes, among the plurality of nodes and including the plurality of first nodes, stored in the non-accelerator pool.

* * * * *